United States Patent
Unno

(10) Patent No.: US 7,829,911 B2
(45) Date of Patent: Nov. 9, 2010

(54) LIGHT EMITTING DIODE

(75) Inventor: Tsunehiro Unno, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 164 days.

(21) Appl. No.: 11/986,076

(22) Filed: Nov. 20, 2007

(65) Prior Publication Data

US 2008/0265267 A1    Oct. 30, 2008

(30) Foreign Application Priority Data

Apr. 25, 2007    (JP) .............................. 2007-115914

(51) Int. Cl.
*H01L 33/38* (2010.01)
(52) U.S. Cl. .................... 257/99; 257/98; 257/E33.065; 257/E33.068
(58) Field of Classification Search ............. 257/79, 257/98–99, E33.062, E33.065, E33.068, 257/E33.069
See application file for complete search history.

(56) References Cited

U.S. PATENT DOCUMENTS

| 6,512,248 | B1 * | 1/2003 | Takeuchi et al. ............. 257/81 |
| 6,784,462 | B2 | 8/2004 | Schubert |
| 7,728,340 | B2 * | 6/2010 | Unno et al. .................... 257/98 |
| 2005/0205886 | A1 * | 9/2005 | Murofushi et al. ............ 257/98 |
| 2007/0018182 | A1 * | 1/2007 | Beeson et al. ................. 257/98 |
| 2007/0145381 | A1 * | 6/2007 | Unno et al. .................... 257/79 |

FOREIGN PATENT DOCUMENTS

| JP | 8-111544 | 4/1996 |
| JP | 2001-144322 | 5/2001 |
| JP | 2003-258316 A | 9/2003 |

* cited by examiner

*Primary Examiner*—Jerome Jackson, Jr.
*Assistant Examiner*—Yu Chen
(74) *Attorney, Agent, or Firm*—Scully, Scott, Murphy & Presser, P.C.

(57) ABSTRACT

At an upper part of au AIGaInP based compound semiconductor layer including an active layer 14 sandwiched by a lower cladding layer 13 and an upper cladding layer 15, a circular electrode 19 for wire bonding and cross-shaped branch electrodes 18 for current spreading connected to the circular electrode 19 arc formed. A contact electrode 17 for current injection is connected to the branch electrodes 18 for current spreading. An interface contact electrode 12 for current injection is provided under the AIGaInP based compound semiconductor layer. A light reflection mirror layer 10 is provided under the interface contact electrode 12 for current injection. The interface contact electrode 12 for current injection is provided right under an outer periphery of the electrode 19 for wire bonding or under a region in vicinity of the outer periphery of the electrode 19 for wire bonding.

11 Claims, 10 Drawing Sheets

LIGHT EMITTING DIODE

The present application is based on Japanese Patent Application No. 2007-115914 filed on Apr. 25, 2007, the entire contents of which are incorporated herein by reference.

BACKGROUND OF THE INVENTION

1. Field of the Invention

The present invention relates to a light emitting diode, in more particular, to a light emitting diode by which electrification at a large current with high efficiency can be realized.

2. Related Art

As for the light emitting diode, since full color light emitting diodes (LEDs) from red to blue have been achieved, application to lighting use is positively tried. However, it is necessary to solve two problems, in order to spread the light emitting diode for the lighting use. Firstly, it is necessary to increase a conversion efficiency of the light emitting diode from a level equal to that of an electric lamp to a level equal to a fluorescent lamp. Secondly, it is necessary to realize the electrification of one light emitting diode at the large current in order to obtain a brightness equal to the electric lamp or the fluorescent lamp by using a few light emitting diodes.

However, when the large current is flown into the light emitting diode, heat is generated, thereby deteriorating the conversion efficiency and the reliability. A first technique for avoiding this problem is to suppress the heat generation as much as possible, and a second technique is to dissipate the heat thus generated immediately to suppress a temperature elevation.

At first, in order to suppress the heat generation as much as possible, it is necessary to convert an electric energy into a light to be extracted as much as possible by increasing a light output efficiency of the light emitting diode. In order to increase the light output efficiency of the light emitting diode, it is necessary to increase an internal quantum efficiency that is an efficiency for recombining injected electrons and holes effectively as high as possible and to increase a light extract efficiency for extracting the emitted light from a LED chip.

Next, as techniques for dissipating the heat, for example, there is a technique for locating a light emitting layer which is a heat-generating part in vicinity of a mounting stem in order to dissipate the heat generated in the light emitting part to the mounting stem, and a technique for using a material with a low thermal resistance for a substrate provided between the light emitting layer and the mounting stem.

In general, the light emitting diode comprises an upper electrode (upper side electrode) having a large area at a light emitting surface, and an active layer included in the light emitting layer emits the light uniformly, so that the light emitted from the active layer in a region which is located right under the upper electrode cannot be totally extracted, due to the upper electrode.

As a light emitting device for avoiding this problem, Japanese Patent Laid-Open No. 2001-144322 (JP-A-2001-144322) and U.S. Pat. No. 6,784,462B2 disclose such light emitting devices, respectively. JP-A-2001-144322 discloses a light emitting device, in which an insulation layer for blocking a current flow is formed under the upper electrode. According to this structure, the current is dispersed in a periphery of the upper electrode, thereby suppressing the light emission right under the upper electrode.

In addition, U.S. Pat. No. 6,784,462B2 discloses a light emitting device, in which a partial electrode for providing an electrical conduction is disposed at a region other than the upper electrode.

However, according to the conventional light emitting diode, even though the device structure disclosed in JP-A-2001-14432 or U.S. Pat. No. 6,784,462B2 is applied, a conductive electrode is located under the light emitting part and a light absorption occurs in the conductive electrode as discussed above, so that a high light output efficiency cannot be realized.

THE SUMMARY OF THE INVENTION

Therefore, it is an object of the invention to provide a light emitting diode by which electrification at a large current with high efficiency can be realized.

According to a first feature of the invention, a light emitting diode comprises:

a compound semiconductor layer including an active layer;

a conductive substrate to be bonded to the compound semiconductor layer;

a first electrode provided at a surface of the compound semiconductor layer for spreading a current in a surface direction;

a light reflection mirror layer provided between the active layer in the compound semiconductor layer and a bonding part of the conductive substrate;

a second electrode provided at an active layer forming side of the light reflection mirror layer to be located right under an outer periphery part of the first electrode or a part in vicinity of the outer periphery part of the first electrode; and a back side electrode provided at a back side surface of the conductive substrate, the back side surface being opposite to a bonding side surface of the conductive substrate to be bonded to the compound semiconductor layer.

In the light emitting diode, the compound semiconductor layer may comprise an AlGaInP based compound semiconductor.

In the light emitting diode, the compound semiconductor layer may comprise an AlGaInN based compound semiconductor.

In the light emitting diode, the compound semiconductor layer may comprise a convexo-concave portion at a first electrode forming side of the compound semiconductor layer in a region other than a region where the first electrode is formed.

In the light emitting diode, the first electrode may comprise a pad electrode and a branch electrode provided on the pad electrode.

Further, the branch electrode may be provided radially from a center of the surface of the compound semiconductor layer.

In the light emitting diode, the first electrode may comprise a pad electrode and a transparent electrode provided on the pad electrode.

The light emitting diode may further comprise an annular contact electrode for current injection provided at the compound semiconductor layer and connected to the first electrode.

In the light emitting diode, the second electrode may be positioned to have an annular shape.

According to present invention, it is possible to provide the light emitting diode by which electrification at a large current with high efficiency can be realized.

BRIEF DESCRIPTION OF THE DRAWINGS

Next, the present invention will be explained in more detail in conjunction with appended drawings, wherein.

DESCRIPTION OF THE PREFERRED EMBODIMENTS

Next, preferred embodiments according to the present invention will be explained in more detail in conjunction with the appended drawings.

First Preferred Embodiment (Structure of a Light Emitting Diode)

Figure 1:
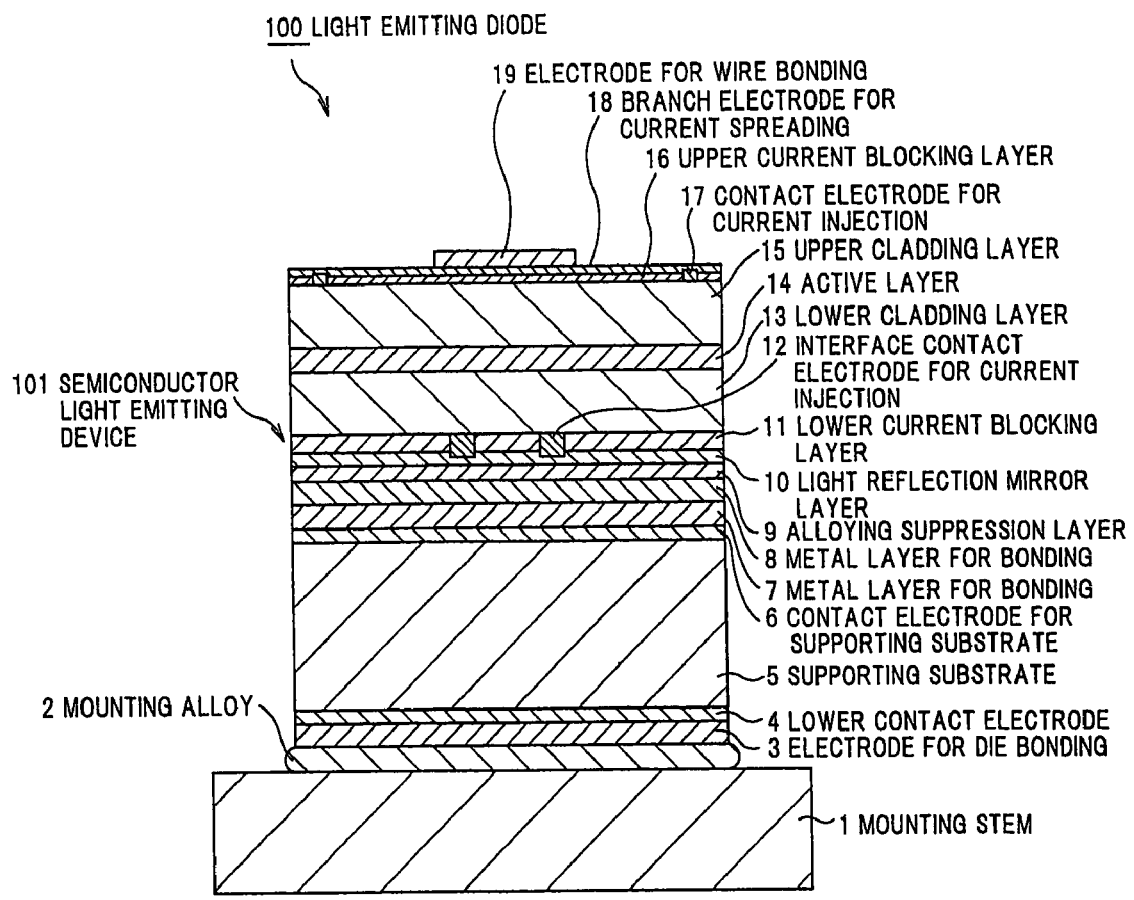
FIG. 1 is a cross sectional view of a light emitting diode in a first preferred embodiment according to the present invention.
Figure 2:
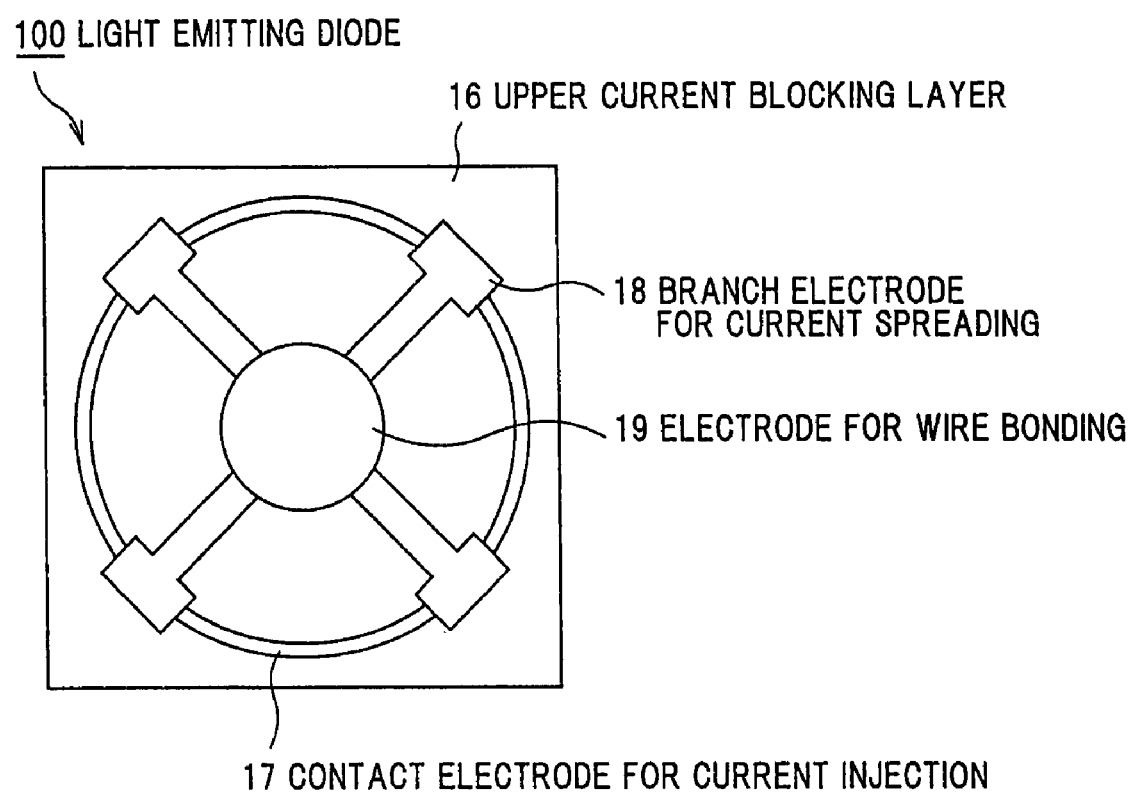
FIG. 2 is a plan view of the light emitting diode shown in FIG. 1.
Figure 3:
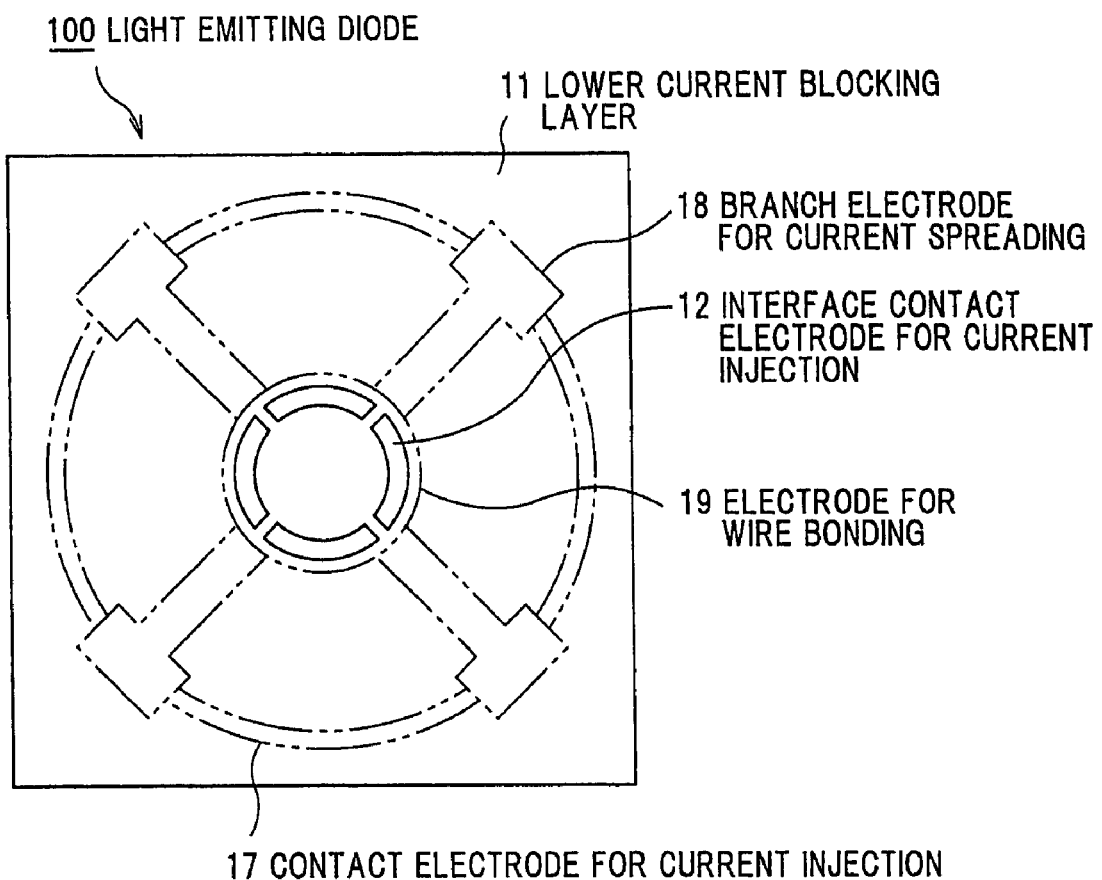
FIG. 3 is a plan view showing an interface contact layer for current injection of the light emitting diode shown in FIG. 1.

FIG. 1 is a cross sectional view of a light emitting diode in a first preferred embodiment according to the present invention. FIG. 2 is a plan view of the light emitting diode shown in FIG. 1. FIG. 3 is a plan view showing an interface contact layer for current injection of the light emitting diode shown in FIG. 1.

FIG. 1 shows a structure of a light emitting diode 100 comprising an AlGaInP based compound semiconductor.

The light emitting diode 100 comprises a semiconductor light emitting device 101, a mounting stem 1, and a mounting alloy 2 for bonding the semiconductor light emitting device 101 and the mounting stem 1.

The semiconductor light emitting device 101 comprises an electrode 3 for die bonding, a lower contact electrode 4, a conductive supporting substrate 5, a contact electrode 6 for the supporting substrate, metal layers 7, 8 for bonding, an alloying suppression layer 9, a light reflection mirror layer 10, a lower current blocking layer 11, a plurality of interface contact electrodes 12 for current injection, a lower cladding layer 13, an active layer 14, an upper cladding layer 15, an upper current blocking layer 16, a contact electrode 17 for current injection, branch electrodes 18 for current spreading, and an electrode 19 for wire bonding provided as a pad electrode for wire bonding.

The lower cladding layer 13, the active layer 14 and the upper cladding layer 15 constitute a light emitting layer. In this preferred embodiment, the light emitting layer is composed of a double hetero structure epitaxial layer of the AlGaInP based compound semiconductor.

The mounting alloy 2 comprises for example a metal composed of AuSn, and is bonded with the mounting stem 1 having a high heat dissipation property.

The electrode 3 for die bonding is a backside electrode that is provided at a backside of the supporting substrate 5, namely a surface opposite to a bonding surface of the supporting substrate 5 to be bonded with the epitaxial layer.

The lower contact electrode 4 is an electrode for taking an electric contact with a side of the mounting stem 1.

The supporting substrate 5 comprises for example a Si substrate having a thickness of 200 μm with a low resistance. In this preferred embodiment, the Si substrate that is available at a low cost is used however the present invention is not limited to the semiconductor. A metallic plate may be used if an electrical conductivity of the metallic plate is excellent. As a metal for this case, a substrate consisted of a single element such as aluminum (Al) may be used. However, the present invention is not limited thereto. An alloy such as CuW with an excellent heat dissipation property may be used. Further, the supporting substrate 5 may have a multilayer structure formed by plating in order to realize a corrosion resistance and a reduction in the contact resistance.

The contact electrode 6 for the supporting substrate is an electrode for taking an electric contact with the light emitting layer.

Each of the metal layers 7, 8 for bonding comprises, for example, a gold (Au) layer.

The alloying suppression layer 9 comprises, for example, a titanium (Ti) layer.

The light reflection mirror layer 10 comprises, for example, a gold (Au) layer, and is electrically connected to the interface contact electrodes 12 for current injection.

The lower current blocking layer 11 comprises, for example, $SiO_2$, and is provided to fill a periphery of a plurality of the interface contact electrodes 12 for current injection.

The interface contact electrodes 12 for current injection are formed as a second electrode that is a partial electrode dispersed in a ring-shape or annularly in the lower current blocking layer 11, and an average radius is 85 μm and a width is 10 μm for example. The interface contact electrodes 12 for current injection are provided beneath the electrode 19 for wire bonding, to be located at an outer periphery side as far as possible, namely at an outermost location.

In addition, the interface contact electrodes 12 for current injection are located at the outermost periphery of the electrode 19 for wire bonding that is the upper electrode with respect to the interface contact electrodes 12 for current injection, such that a total area of the interface contact electrodes 12 is reduced to be minimum, and a series resistance of the interface contact electrodes 12 for current injection is reduced to be minimum, in order to suppress the light absorption by the interface contact electrodes 12 for current injection to be minimum.

The lower cladding layer 13 comprises, for example, a p-type AlGaInP.

The active layer 14 has a quantum well structure.

The upper cladding layer 15 comprises, for example, a n-type AlGaInP.

The upper current blocking layer 16 comprises, for example, $SiO_2$.

The contact electrode 17 for current injection is an electrode for injecting a current into the epitaxial layer, and is provided annularly at the upper current blocking layer 16.

The branch electrodes 18 for current spreading is provided for electrically connecting the electrode 19 for wire bonding with the contact electrode 17 for current injection, and spread the current along a surface direction. As shown in FIG. 2, the branch electrodes 18 for current spreading are provided at the upper current blocking layer 16 in a cross shape (radially) along diagonal directions from a center of the electrode 19 for wire bonding provided at a surface of the semiconductor light emitting device 101.

The electrode 19 for wire bonding is provided in a circular shape at a center of an upper part of the upper current blocking layer 16 as well as a center of the branch electrodes 18 for current spreading. The electrode 19 for wire bonding is for example formed to have a diameter of 100 μm, and the electrode 19 for wire bonding and the branch electrodes 18 for current spreading constitute a first electrode.

(Method for Fabricating the Light Emitting Diode)

Next, a method for fabricating the light emitting diode 100 will be explained below.

Firstly, an epitaxial layer comprising four layers of AlGaInP based compound semiconductors is grown on an n-type GaAs substrate by using a MOCVD (Metal Organic Chemical Vapor Deposition) method.

Next, an etching stopper layer is formed on the n-type GaAs substrate, then an upper cladding layer 15, an AlGaInP quantum well active layer 14, and a lower cladding layer 13 are sequentially formed to provide an epitaxial wafer.

Then, at a surface of the epitaxial wafer, a $SiO_2$ film is formed as a transparent insulation layer, to provide a lower current blocking layer 11.

Next, holes for forming interface contact electrodes 12 for current injection are formed at the $SiO_2$ film by photolithography and etching, to provide the lower current blocking layer 11. A configuration of the holes is as illustrated in FIG. 3. In each of these holes, the interface contact electrode 12 for current injection comprising a multilayer structure of Ti/AuBe/Au is formed by vapor deposition and lift-off method.

Thereafter, on the interface contact electrodes 12 for current injection, a light reflection mirror layer 10 comprising Au, an alloying suppression layer 9 comprising Ti, and a metal layer 8 for bonding comprising Au are sequentially formed by the vapor deposition. In addition, it is preferable to provide an adhesion layer for improving the adhesion thinly between the lower current blocking layer 11 and the light reflection mirror layer 10.

Next, at a surface of the Si substrate serving as a supporting substrate 5, a contact electrode 6 for the supporting substrate comprising Ti and a metal layer 7 for bonding comprising Au are formed by the vapor deposition for the purpose of taking a junction with the electrical conductive material, to provide a Si wafer.

Then, two pieces of wafers, namely the epitaxial wafer and the Si wafer are overlapped with each other, such that the metal layer 8 for bonding at the epitaxial wafer side and the metal layer 7 for bonding at the Si wafer side are faced to each other, and installed into a bonding apparatus. As the bonding apparatus, a wafer bonding apparatus commercialized for micromachining may be used. In this wafer bonding apparatus, two wafers overlapped with each other are set.

Next, a high vacuum state is realized inside the wafer bonding apparatus. Then, an elevation of a temperature of the wafer bonding apparatus is started, and after having reached around 350° C., the temperature is maintained for about 1 hour. Then, the temperature of the wafer bonding apparatus is lowered and pressurization is thrown opened at a point where the temperature sufficiently fell down, so that the pressure inside the wafer bonding apparatus is returned to an atmospheric pressure. Thereafter, the bonded wafers are taken out from the wafer bonding apparatus.

Next, the wafer is affixed to a lapping plate such that a surface at the GaAs substrate side of the bonded wafer is provided as a front surface, and the GaAs substrate is polished by lapping. At a point where a remaining thickness of the GaAs substrate is 30 μm, the lapping is stopped, and the wafer is detached from the lapping plate.

After removing a bonding wax from this wafer, the wafer is put into an etching atmosphere for GaAs, and the GaAs substrate is completely removed. After having removed the GaAs substrate, the etching process is finished.

Next, the etching stopper layer is removed by conducting the etching after changing the etching liquid. According to this process, an epitaxial wafer for a light emitting diode having metal layers for bonding at interfaces thereof is provided. The light emitting diode is provided by forming electrodes at a front side and a back side of the epitaxial wafer for a LED.

Next, a process of fabricating a LED chip will be explained below.

Firstly, a convexo-concave portion is periodically and uniformly formed by the photolithography and the etching with a dimension of 0.5 μm and a pitch of 1 μm at a region other than a region where the upper electrode of the epitaxial wafer for a light emitting diode thus fabricated is formed.

It has been well known that formation of the convexo-concave portion is effective for extracting a light. However, it is significantly effective to reflect the light by forming the convexo-concave portion for changing a reflection angle of the light at the front side or at the interface side of the light emitting diode.

Next, on a surface at a light extracting side of the epitaxial wafer for a LED, an upper current blocking layer 16 comprising $SiO_2$ is formed.

Next, a hole for forming a contact electrode 17 for current injection is formed at the upper current blocking layer 16 by the photolithography and the etching. A configuration of this hole corresponds to a configuration of the contact electrode 17 for current injection shown in FIG. 2, and the hole is formed annularly, for example, to have a width of 10 μm at a location distant from the center by 100 μm.

In the hole, the contact electrode 17 for current injection comprising an electrode of AuGe/Ni/Au is formed by a laser lift-off method. At this time, it is enough to form a GaAs thin film with a high carrier concentration at the surface of the epitaxial layer for taking a good contact, thereby achieving a low resistance.

Next, an electrode 19 for wire bonding and branch electrodes 18 for current spreading are formed on the contact electrode 17 for current injection and the upper current blocking layer 16 by the photolithography and the vapor deposition. Each of the electrode 19 for wire bonding and the branch electrodes 18 for current spreading has a double layer structure comprising an adhesion layer and a gold layer.

Next, a lower contact electrode 4 comprising Ti and an electrode 3 for die bonding are formed on an entire surface of a bottom side of the supporting substrate 5 by the vapor deposition.

After finishing the above process, an alloying process is conducted for flowing the current with a low resistance. Thereafter, a group of light emitting diodes formed on the epitaxial wafer for a LED are separated into respective devices by a mesa isolation process, and are cut by dicing, to complete the fabrication of the LED chips.

Figure 4:
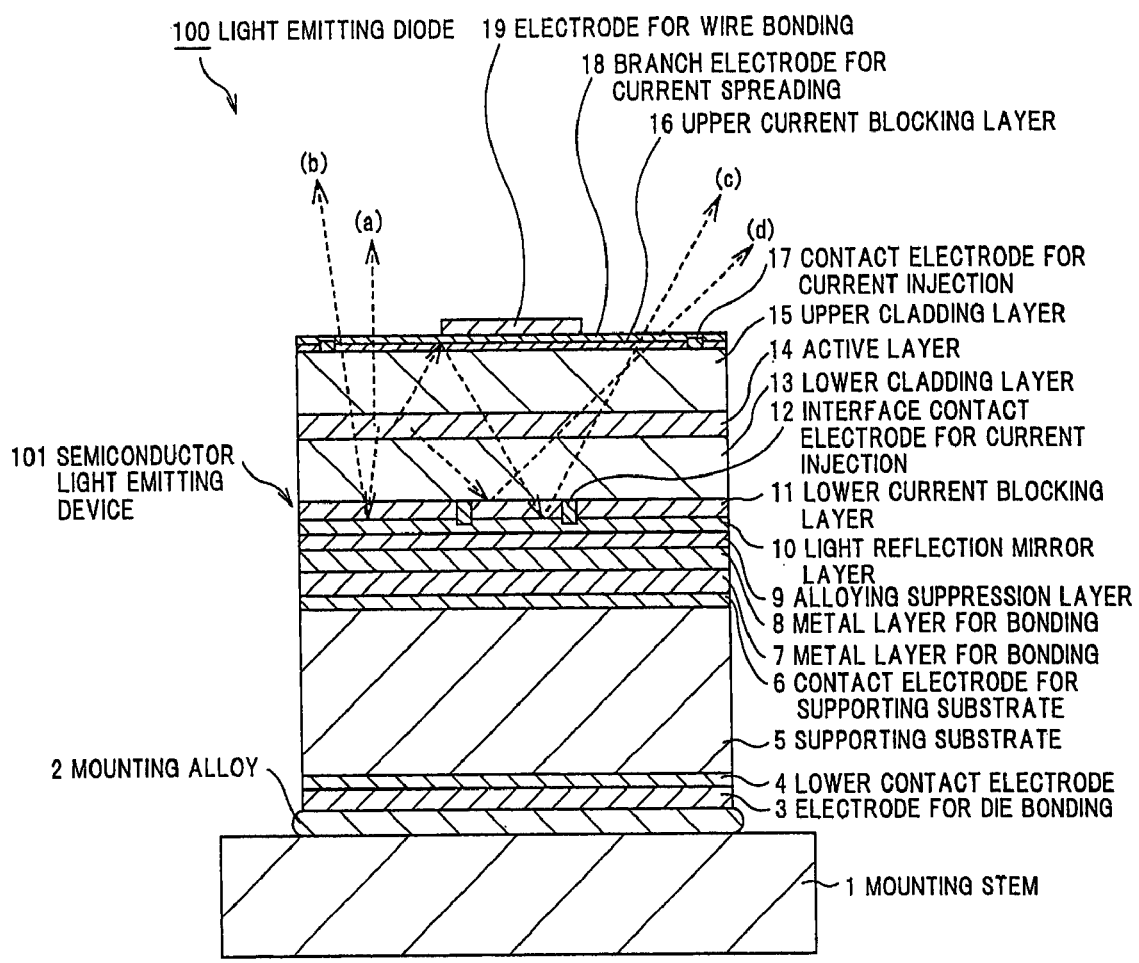
FIG. 4 is an explanatory diagram showing a light reflection in the light emitting diode in the first preferred embodiment according to the present invention.

FIG. 4 is an explanatory diagram showing a light reflection in the light emitting diode in the first preferred embodiment.

When the current is flown into the light emitting diode 100, the light emitting layer emits the light. The light emitted from the active layer 14 is emitted toward the upper cladding layer 15 and the lower cladding layer 13 as indicated by (a) to (d), and is reflected more than once at a lower surface of the electrode 19 for wire bonding, the light reflection mirror layer 10, the interface contact electrodes 12 for current injection or the like.

As for the emitted lights (a) to (d), a part of these lights is absorbed by the electrode 19 for wire bonding and the interface contact electrode 12 for current injection. However, most of the lights are emitted from an upper surface of the light emitting layer to the outside.

Effect of the First Preferred Embodiment

According to the first preferred embodiment, following effects can be obtained.

(1) The interface contact electrodes 12 for current injection, the contact electrode 17 for current injection, and the branch electrodes 18 for current spreading are configured to hardly function as a light absorption layer, in which almost 100% of the light emitted to a direction opposite to an electrode surface can be reflected. Therefore, the light absorption by the respective electrodes hardly occurs, a light reflectance is improved, and a high light output can be stably obtained.

(2) Since the light reflectance is improved, it is possible to reduce a power consumption.

(3) Since the photoelectric conversion efficiency is increased, it is possible to suppress the heat generation inside the light emitting diode. As a result, it is possible to obtain a light emitting diode which does not generate the heat even though a large current is flown.

In this preferred embodiment, the active layer 14 functioning as the light emitting layer is sandwiched by cladding layers 13, 15 at both sides, to provide the cladding layers 13, 15 with both of a current confinement effect and a current spreading effect.

It has been known that a thickness of the epitaxial layer can be reduced or a cost of the epitaxial layer can be lowered, by assigning the current confinement function and the current spreading function to the respective cladding layers separately, so as to reduce thickness of the cladding layers 13, 15. Accordingly, the configuration using this knowledge may be applied to this preferred embodiment. In particular, such a configuration is effective at the time that a size of the LED chip is large for example. It is sufficient if the current spreading layer is provided between the semiconductor layer and the upper current blocking layer 16. Further, the current spreading layer may be substituted with a conductive film that is transparent with respect to an emission wavelength, such as an ITO film.

EXAMPLE 1

An LED chip (light emitting diode 100) thus fabricated with dimensions of 0.3 mm×0.3 mm and a thickness of 200 μm was mounted on a mounting stem 1, and resin molding was conducted for the LED chip, to provide an LED device. Then, characteristics of the LED device in the Example 1 were evaluated. As a result, an emission wavelength was 630 nm, a forward voltage was 2.01 V, and a light output was 24 to 26 mW at a forward current of 20 mA (at the time of evaluation). Therefore, it was confirmed that the photoelectric conversion efficiency was remarkably improved compared with the LED devices reported until now.

Further, a current/light output characteristic was measured by flowing a large current up to 100 mA in the light emitting diode 100. As a result, a good linearity in the current/light output characteristics was confirmed. It is supposed that a good thermal conductivity was obtained since the supporting substrate S comprises Si, and the heat generation in the light emitting diode 100 is reduced since the light extract efficiency of the compound semiconductor layer is high. Therefore, even though the large current is flown, the high efficiency can be obtained.

The reason why the light extract efficiency can be improved is that the area of the interface contact electrodes 12 for current injection as a partial electrode can be reduced to be equal to or less than ⅕ of a first ohmic contact partial electrode 211 in a comparative example as explained later.

COMPARATIVE EXAMPLE

Figure 5:
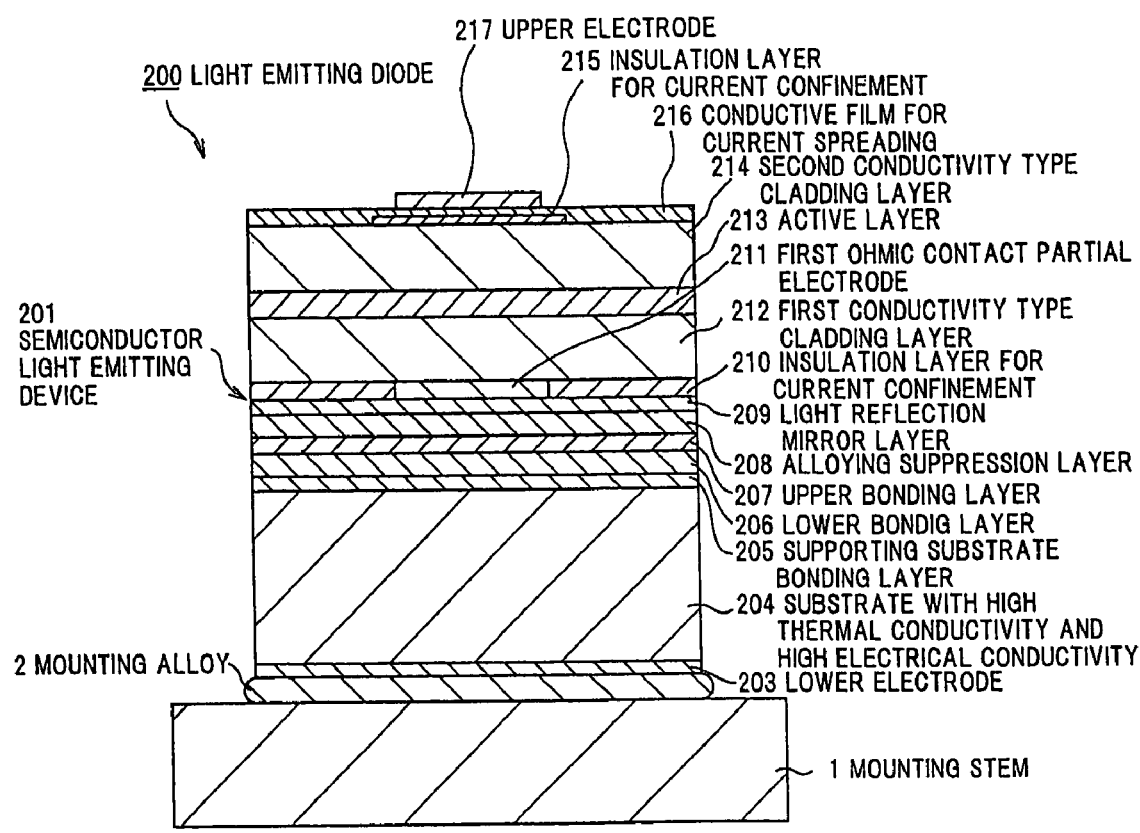
FIG. 5 is a cross sectional view of a light emitting diode in a comparative example.

FIG. 5 is a cross sectional view of a light emitting diode in a comparative example.

A light emitting diode 200 comprises a semiconductor light emitting device 201, a mounting stem 1, and a mounting alloy 2 for bonding the semiconductor light emitting device 201 and the mounting stem 1.

The semiconductor light emitting device 200 comprises a lower electrode 203, a substrate 204 with high thermal conductivity and high electrical conductivity, a supporting substrate bonding layer 205, a lower bonding layer 206, an upper bonding layer 207, an alloying suppression layer 208, a light reflection mirror layer 209, an insulation layer 210 for current confinement, a first ohmic contact partial electrode 211, a first conductivity type cladding layer 212, an active layer 213, a second conductivity type cladding layer 214, an insulation layer 215 for current confinement, a conductive film 216 for current spreading, and an upper electrode 217.

The ohmic contact partial electrode 211 is provided by removing a center of the insulation layer 210 for current confinement.

The insulation layer 215 for current confinement is provided at a center of the second conductivity type cladding layer 214.

The conductive film 216 for current spreading is provided to cover the insulation layer 215 for current confinement and an exposed region of the second conductivity type cladding layer 214.

The upper electrode 217 is provided at a center of the conductive film 216 for current spreading.

Compared with the light emitting diode in the first preferred embodiment according to the invention, the light extract efficiency of the light emitting diode 200 of FIG. 5 is still low. The reason for this phenomenon is that the light emitted from the active layer 213 is absorbed by the upper electrode and the interface electrodes due to the multiple reflections in the epitaxial layer. The reason for this phenomenon will be explained in more detailed in conjunction with FIG. 6.

Figure 6:
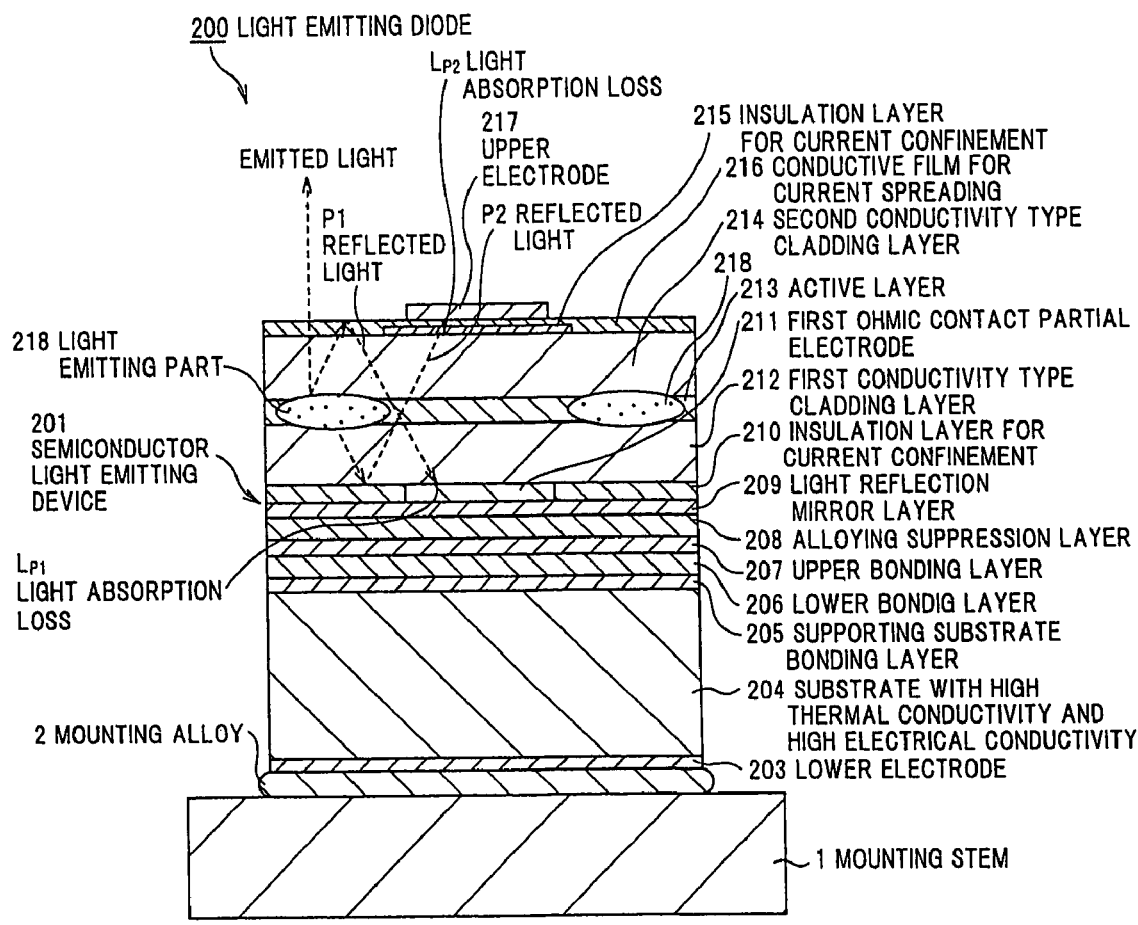
FIG. 6 is a schematic cross sectional view for explaining problems of the light emitting diode in the comparative example.

FIG. 6 is a schematic cross sectional view for explaining problems of the light emitting diode in the comparative example. A reflected light P1 at a surface and a reflected light P2 at an interface can be partially extracted from the surface. However, other reflected lights are reflected repeatedly between the surface and the interface, and reach to a region right under the upper electrode 217.

Herein, the other reflected lights are absorbed by the upper electrode 217 and the ohmic contact partial electrode 211 provided right under the upper electrode 217. A light absorption loss Lp1 caused at the upper electrode 217 and the ohmic contact partial electrode 211 at this time remarkably affects on the efficiency of the light emitting diode. In addition, a part with a strong light intensity in the light emitting part 218 is a periphery of the upper electrode 217 as described above. Further, the light emission occurs also in the region right under the upper electrode 217, and this is one of factors of causing a light absorption loss Lp2.

In the comparative example, a light absorption layer provided under the upper electrode 217 is also one of the factors of causing the light absorption loss Lp2.

On the contrary, in the light emitting diode 100 in the first preferred embodiment according to the present invention, a light reflection layer with an excellent reflectance is provided under the upper electrode, thereby reducing the light absorption loss.

Second Preferred Embodiment

Figure 7:
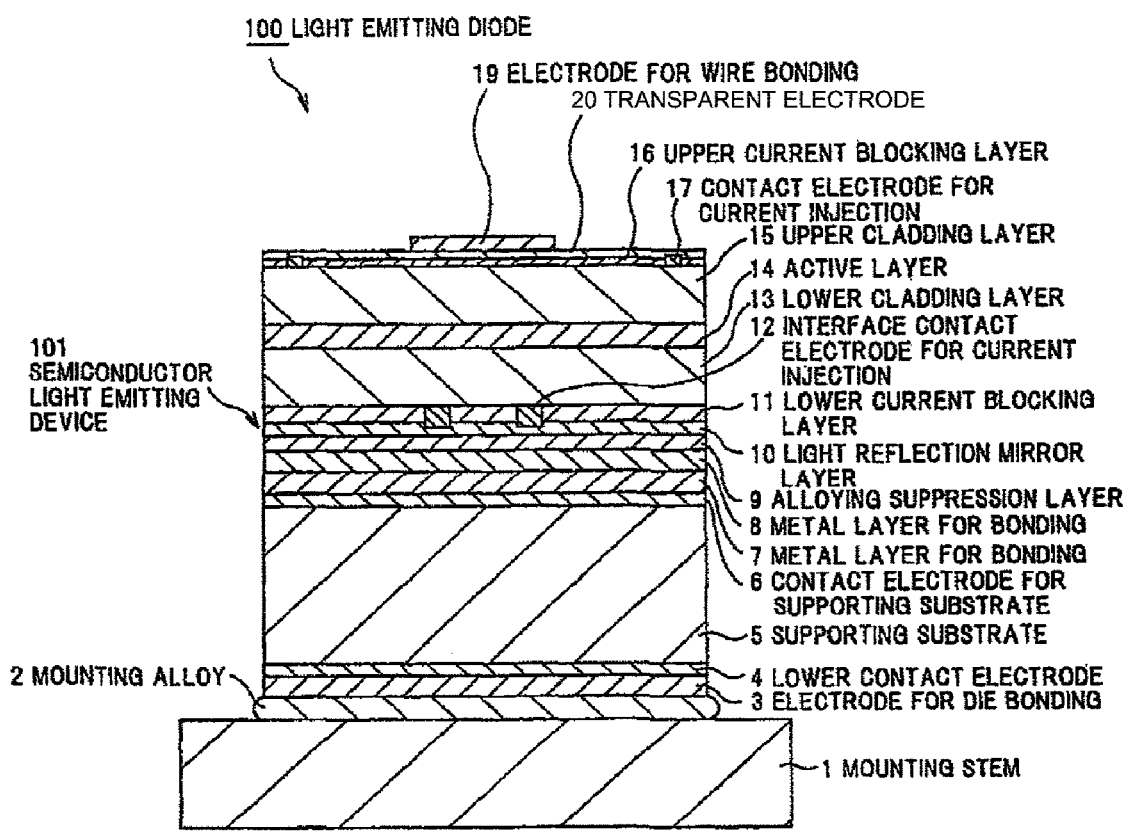
FIG. 7 is a cross sectional view of a light emitting diode in a second preferred embodiment according to the present invention.

FIG. 7 is a cross sectional view of a light emitting diode in a second preferred embodiment according to the present invention.

The light emitting diode 100 in the second preferred embodiment of the present invention is similar to the light emitting diode 100 in the first preferred embodiment according to the present invention, except that a transparent electrode 20 that is transparent with respect to the emission wavelength is used in place of the branch electrodes 18 for current spreading.

A configuration and a dimension of the transparent electrode 20 may be similar to those of the branch electrodes 18 for current spreading. Since the transparent electrode 20 is transparent, an area of the transparent electrode 20 may be increased compared with the branch electrodes 18 for current spreading.

An advantage of using the transparent electrode 20 is that the light emission is suppressed by a presence of the transparent electrode 20, when the light emitted from the light emitting layer goes out of the semiconductor light emitting device 101, compared with the light emitting diode 100 in the first preferred embodiment in which such a light emission is suppressed by a presence of the branch electrodes 18 for current spreading. In particular, when a chip size is small, the light emission is not suppressed by a presence of the transparent electrode 20, so that it is effective for improving the light reflectance.

Alternative Embodiment

Figure 8:
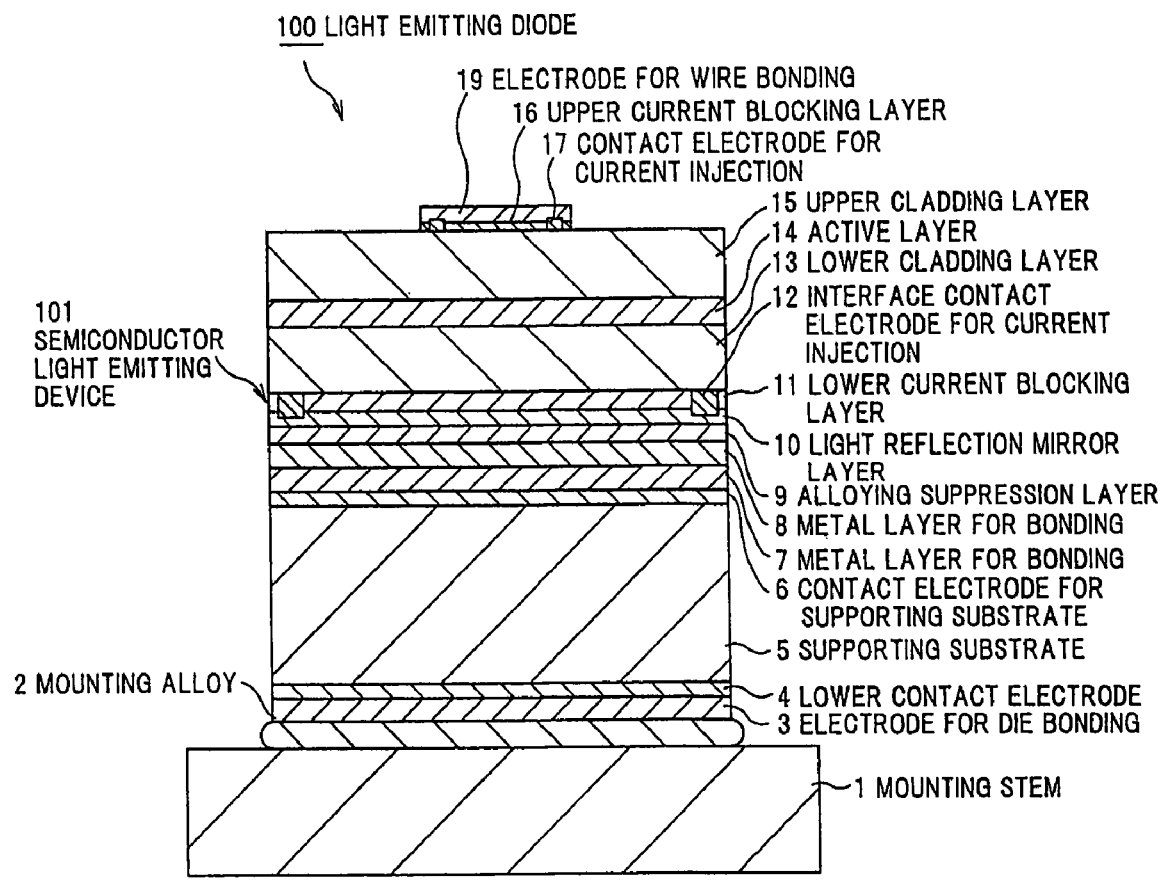
FIG. 8 is a cross sectional view of a light emitting diode in an alternative embodiment according to the present invention.

FIG. 8 is a cross sectional view of a light emitting diode in an alternative embodiment according to the present invention. The light emitting diode 100 in the embodiment of the present invention is similar to the light emitting diode 100 in the second preferred embodiment according to the present invention, except that a configuration of the contact electrode 17 and a configuration of the interface contact electrodes 12 for current injection are changed, and the transparent electrode 20 is not provided.

In the light emitting diode 100 in the embodiment shown in FIG. 8, the branch electrode is not provided at a light emitting side (front side), the light extract efficiency from the front side can be increased.

In the structure shown in FIG. 8, since the interface contact electrode 12 for current injection is located to be viewed from the front side, the light absorption loss easily occurs. Further, in an electric current injected from the contact electrode 17 for current injection, a component flown toward a lower part of the electrode 19 for wire bonding is large, so that the light absorption loss between the contact electrode 17 and the electrode 19 for current injection is increased. However, compared with the structure in the comparative example, it is possible to reduce the light absorption loss in accordance with a reduction in the light absorption part under the electrode 19 for wire bonding.

In accordance with an increase in a size of the light emitting diode 100, a length of a current path in the epitaxial layer from an outer periphery of the chip to an inner periphery of the chip is increased. Accordingly, when the chip size is increased, it is possible to lower a drive voltage (forward voltage) by providing a number of annular upper electrodes in place of a single annular upper electrode, and providing a plurality of annular contact electrodes at a bonding part.

Third Preferred Embodiment

Figure 9:
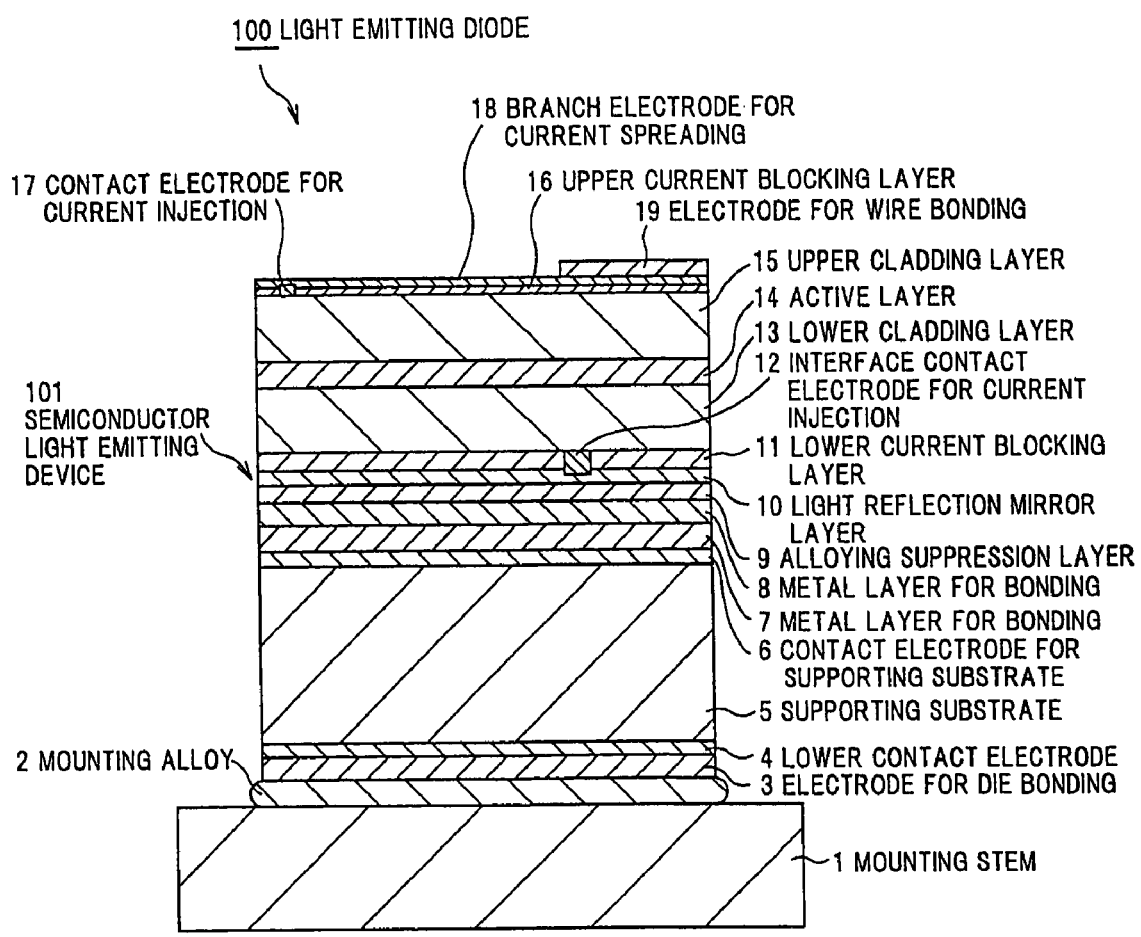
FIG. 9 is a cross sectional view of a light emitting diode in a third preferred embodiment according to the present invention.

FIG. 9 is a cross sectional view of a light emitting diode in a third preferred embodiment according to the present invention. The light emitting diode 100 in the third preferred embodiment of the present invention is similar to the light emitting diode 100 in the first preferred embodiment according to the present invention, except that a location of the electrode 19 for wire bonding is changed from a center of the upper cladding layer 15 to vicinity of an outer periphery of the upper cladding layer 15, and the interface contact electrode 12 for current injection is provided at a region under the electrode 19 for wire bonding.

The chip configuration is often changed from a square shape to a rectangular shape in late years. According to the third preferred embodiment, it is possible to apply the light emitting diode to the LED chips having rectangular shape.

Another Alternative Embodiment

Figure 10:
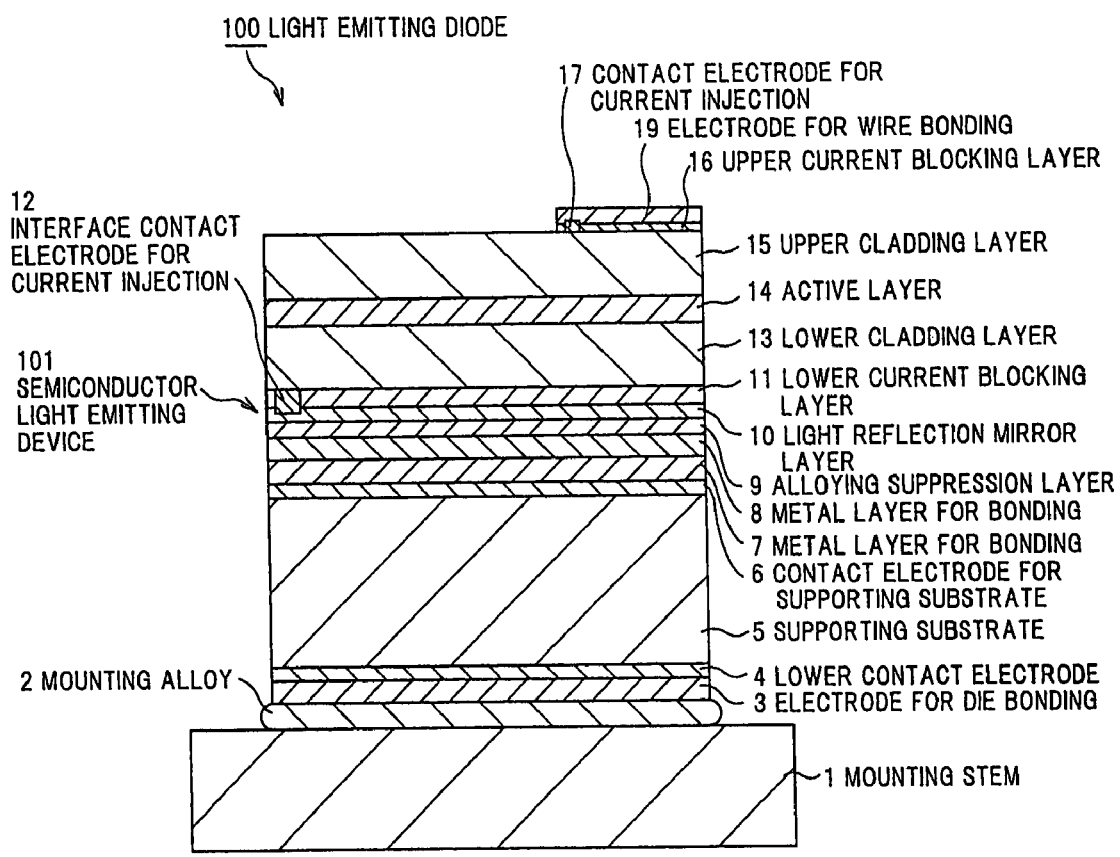
FIG. 10 is a cross sectional view of a light emitting diode in another alternative embodiment according to the present invention.

FIG. 10 is a cross sectional view of a light emitting diode in another alternative embodiment according to the present invention. The light emitting diode 100 in the embodiment shown in FIG. 10 of the present invention is similar to the light emitting diode 100 in the embodiment shown in FIG. 8 according to the present invention, except that a location of forming the electrode 19 for wire bonding and a location of forming the upper current blocking layer 16 are changed from the center of the upper cladding layer 15 to a region in vicinity of an outer periphery of the upper cladding layer 15, and one of the interface contact electrodes 12 for current injection is removed from a region under the electrode 19 for wire bonding.

In the embodiment shown in FIG. 10, effects similar to those in the fourth preferred embodiment can be obtained.

In the alternative embodiment shown in FIG. 10, effects similar to those in the third preferred embodiment can be obtained.

Other Preferred Embodiments

The present invention is not limited to the above preferred embodiments, and various modifications are possible without going beyond a scope of the technical idea of the present invention.

For example, in the above preferred embodiments, the light emitting diode comprising the AlGaInP based compound semiconductor layers are explained however the present invention is not limited thereto. Similar effects can be expected in a light emitting diode comprising AlGaInN based compound semiconductor layers. Since a crystal growth using a sapphire substrate is conducted for the AlGaInN based compound semiconductor, a bonding structure using a metal layer has not been proposed. By fabricating the light emitting diode using the bonding structure, the heat dissipation property can be significantly improved. Accordingly, in the large current light emitting diodes, this bonding structure is effective for improving the heat dissipation property.

Further, in the above preferred embodiments, the active layer 14 has the quantum well structure however the present invention is not limited thereto. The effect of the active layer 14 can be achieved enough by using a double hetero structure.

According to the light emitting diode of the present invention, it is possible to achieve a photoelectric conversion efficiency higher than the conventional device by not less than 50%, with a good reproducibility. Accordingly, the invention is effective for energy saving that is required for a small current electrification, such as a use of a portable phone in which a little depletion of battery is desirable.

Further, when the light emitting diode in the preferred embodiments according to the present invention is used for a lamp device or the like to which a large current is flown, since the excellent heat dissipation property can be obtained, it is possible to drive the device with a large current, and the effect is remarkable. In this case, it is preferable to use a eutectic alloy such as Au/Sn at the time of mounting, in order to secure the excellent heat dissipation property.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting diode, comprising:
a compound semiconductor layer including an active layer;
a conductive substrate bonded to the compound semiconductor layer;
a first current blocking layer comprising a transparent insulating film provided on the compound semiconductor layer;
a first electrode provided on the first current blocking layer, the first electrode comprising a pad electrode and a current spreading electrode extending from the pad electrode;
a second current blocking layer comprising a transparent insulating film provided between the active layer and the conductive substrate;
a light reflection mirror layer provided between the active layer and the conductive substrate;
a second electrode passing through the second current blocking layer, the second electrode being provided only in a region overlapping the pad electrode in a top view; and
a third electrode passing through the first current blocking layer, the third electrode electrically connecting the current spreading electrode to the compound semiconductor layer.

2. The light emitting diode according to claim 1, wherein the compound semiconductor layer comprises an AlGaInP based compound semiconductor.

3. The light emitting diode according to claim 1, wherein the compound semiconductor layer comprises an AlGaInN based compound semiconductor.

4. The light emitting diode according to claim 1, wherein the compound semiconductor layer comprises an irregular surface in a region other than a region overlapping the first electrode in the top view.

5. The light emitting diode according to claim 1, wherein the current spreading electrode extending radially from the pad electrode.

6. The light emitting diode according to claim 1, further comprising:
a back side electrode provided at a back side surface of the conductive substrate, the back side surface being opposite to the first electrode with respect to the compound semiconductor layer.

7. The light emitting diode according to claim 1, wherein the second electrode comprises Au-based material.

8. The light emitting diode according to claim 1, wherein the second electrode comprises an annular shape.

9. The light emitting diode according to claim 1, wherein the current spreading electrode comprises a transparent electrode.

10. The light emitting diode according to claim 1, wherein the third electrode overlaps the current spreading electrode in the top view.

11. The light emitting diode according to claim 1, wherein the pad electrode comprises a circular shape.

* * * * *